(12) United States Patent
Suzuki

(10) Patent No.: US 6,927,124 B2
(45) Date of Patent: *Aug. 9, 2005

(54) METHOD OF MANUFACTURING SEMICONDUCTOR DEVICE

(75) Inventor: So Suzuki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/856,551

(22) Filed: May 28, 2004

(65) Prior Publication Data

US 2004/0219749 A1 Nov. 4, 2004

Related U.S. Application Data

(63) Continuation of application No. 10/303,869, filed on Nov. 26, 2002, now Pat. No. 6,784,067.

(30) Foreign Application Priority Data

Jun. 12, 2002 (JP) ........................................ 2002-170952

(51) Int. Cl.⁷ .......................................... H01L 21/8242
(52) U.S. Cl. ...................... 438/250; 438/253; 438/390; 438/3
(58) Field of Search .............................. 438/3, 238–240, 438/250–256, 381, 393–399

(56) References Cited

U.S. PATENT DOCUMENTS

| 6,352,920 B1 | 3/2002 | Shimomura |
| 6,475,860 B2 | 11/2002 | Kwon et al. |
| 6,509,593 B2 | 1/2003 | Inoue et al. |
| 6,579,753 B2 | 6/2003 | Yamanobe |
| 6,664,162 B2 * | 12/2003 | Okada ........................ 438/243 |
| 2002/0022335 A1 * | 2/2002 | Chen .......................... 438/396 |

FOREIGN PATENT DOCUMENTS

| JP | 10-056063 | 5/1996 |
| JP | 2000-133708 | 5/2000 |
| JP | 2001-176877 | 6/2001 |
| JP | 2001-274340 | 10/2001 |

* cited by examiner

*Primary Examiner*—H. Jey Tsai
(74) *Attorney, Agent, or Firm*—Rabin & Berdo, PC

(57) ABSTRACT

In a method of manufacturing a capacitor, a semiconductor substrate is provided. On the semiconductor substrate, a transistor is formed. Then, a first conductive layer is formed on the substrate. An insulating layer is formed on the first conductive layer. A second conductive layer is formed on the insulating layer. The second conductive layer is patterned to form an upper electrode. Finally, the first conductive layer is patterned to form a lower electrode and a conductive pattern after the formation of the upper electrode.

20 Claims, 3 Drawing Sheets

METHOD OF MANUFACTURING SEMICONDUCTOR DEVICE

CROSS-REFERENCE TO RELATED APPLICATION

This is a continuation of application Ser. No. 10/303,869, filed Nov. 26, 2002 Pat. No. 6,784,067.

BACKGROUND OF THE INVENTION

1. Field of the Invention

The present invention relates to a method of manufacturing a semiconductor device, and specifically to a method, which enhances the reliability of an insulating film of a capacitor and prevents penetration of contact holes through a capacitor electrode.

2. Description of the Related Art

Enhancing the reliability of an insulating film interposed between an upper electrode and a lower electrode of a capacitor is very important to a method of manufacturing a semiconductor device. In a method of manufacturing a semiconductor device including a conventional capacitor structure, a transistor is first formed on a wafer. A metal layer which provides a lower electrode of a capacitor, and an insulating film for the capacitor, which is formed off an Si oxide film or the like, are deposited over the transistor in this order.

The metal layer (generally called simply "metal" hereafter) and the insulating film are patterned so as to form a lower electrode and dielectric, and a capacitor metal layer (generally called simply "capacitor metal" hereafter) is formed thereon. The capacitor metal is patterned to form an upper electrode. In order to make contact with the lower and upper electrodes, contact holes are fabricated in an interlayer film formed at their upper portions.

In the aforementioned conventional manufacturing method, the lower electrode is first patterned and thereafter the capacitor metal (CM) is deposited and etched to form the upper electrode. However, since a resist is directly applied onto the insulating film upon patterning of the lower electrode in the conventional manufacturing method, the resist is directly applied even to an area interposed between the upper and lower electrodes on the insulating film as a matter of course. Therefore, the film quality of the surface of the insulating film changes and is affected by an organic release agent or the like even upon removing the resist on the insulating film after the etching, thereby deteriorating the reliability of the insulating film.

If an etching-rate selection ratio is low when the contact holes are collectively made open on the lower and upper electrodes by etching, then there is a possibility that the upper electrode will be excessively etched due to the difference between their depths, and the contact holes will be defined through the upper electrode.

Further, when the organic release agent or the like for removing the resist infiltrates into edge portions of the upper electrode upon formation of the lower electrode by etching, this will influence the quality of the insulating film near the edge portions. Furthermore, a problem arises in that when the interlayer film is deposited by CVD or the like using plasma after the formation of the capacitor, the insulating film is damaged by the plasma of CVD and thereby brought into deterioration, whereby the reliability of the insulating film is reduced.

SUMMARY OF THE INVENTION

The present invention may provide a method of manufacturing a semiconductor device having a capacitor, wherein an insulating film is high in reliability.

In a method of manufacturing a capacitor of the present invention, a semiconductor substrate is provided. On the semiconductor substrate, a transistor is formed. Then, a first conductive layer is formed on the substrate. An insulating layer is formed on the first conductive layer. A second conductive layer is formed oh the insulating layer. The second conductive layer is patterned to form an upper electrode. Finally, the first conductive layer is patterned to form a lower electrode and a conductive pattern after the formation of the upper electrode.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
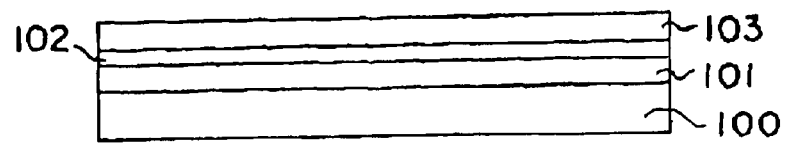
FIGS. 1(*a*) through 1(*f*) are respectively schematic cross-sectional views for describing process steps of a method of manufacturing a semiconductor device, according to a first embodiment.
Figure 1B:
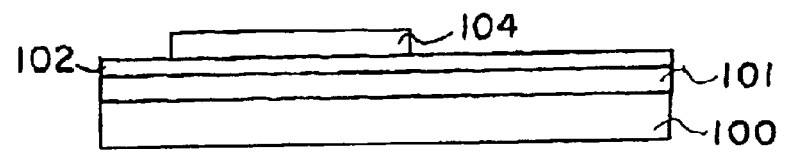

Preferred embodiments of the present invention will hereinafter be described in detail with reference to the accompanying drawings.

A first embodiment of the present invention, showing a method of manufacturing a semiconductor device will be explained. According to the method of manufacturing the semiconductor device of the first embodiment, a conductive layer is formed in accordance with the following procedures in a conductive layer forming process step subsequent to the formation of a transistor. The method of manufacturing the semiconductor device, according to the first embodiment will be described below using FIG. 1.

A transistor (not shown) is first formed on a semiconductor substrate 100. Thereafter a capacitor lower electrode metal (2M) 101, an insulating film 102, and a capacitor upper electrode metal layer (CM) 103 are deposited on the semiconductor substrate 100 in this order as shown in FIG. 1(*a*). The metal layer 101 will generally be called simply "metal" 101 hereafter and similarly, the metal layer 103 will be called simply "metal" 103, with the term "layer" being omitted for the sake of convenience. An Si oxide film or the like can be used as the insulating film 102.

Next, the surface of the upper electrode metal (CM) 103 is coated with a resist, and an unnecessary area is removed from the upper electrode metal (CM) 103 by etching and the metal (CM) 103 is patterned, thereby forming an upper electrode 104 on the insulating film 102 as shown in FIG. 1(*b*). Since the insulating film 102 is interposed between the metal (CM) 103 and the metal (2M) 101, the resist is not directly applied onto its surface. Incidentally, the resist placed over the upper electrode 104 and the insulating film 102 is removed by an organic release agent or the like after the etching.

Figure 1C:
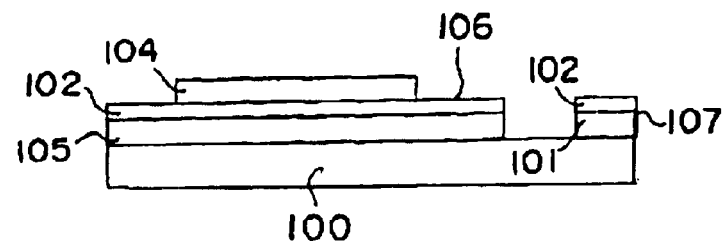

After the formation of the upper electrode 104, the metal (2M) 101 is etched to remove an unnecessary area and subjected to patterning, thereby forming a lower electrode 105. A capacitor 106 is formed of the upper electrode 104, insulating film 102 and lower electrode 105 as shown in FIG. 1(c) in this way. In the present embodiment, the metal (2M) 101 is patterned to form the lower electrode 105 and form a conductive metal 107 comprised of the metal (2M) 101 and the insulating film 102.

Figure 1D:
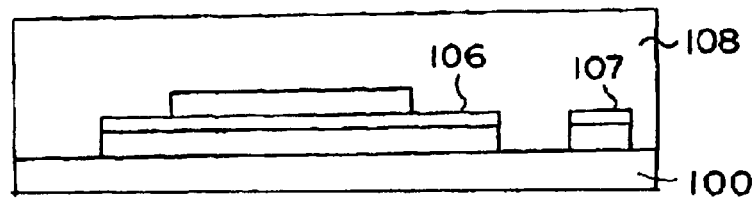
Figure 1E:
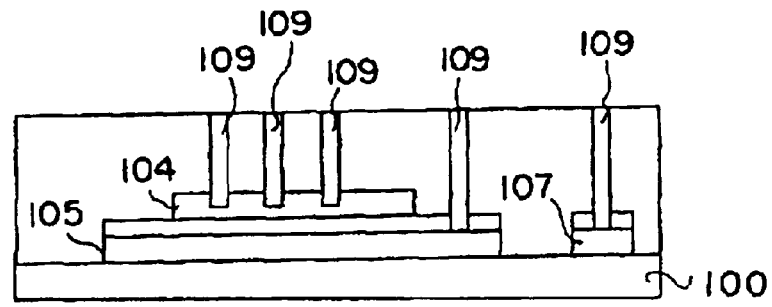

Thereafter, as shown in FIG. 1(d), an interlayer film 108 is deposited over the capacitor 106 and the conductive metal 107. Further, the surface of the interlayer film 108 is planarized by CMP or the like and hereafter contact holes 109 are formed to the upper electrode 104, lower electrode 105 and conductive metal 107 by batch or block etching as shown in FIG. 1(e). Incidentally, the deposition of the interlayer film 108 can be carried out by CVD or the like using plasma.

Figure 1F:
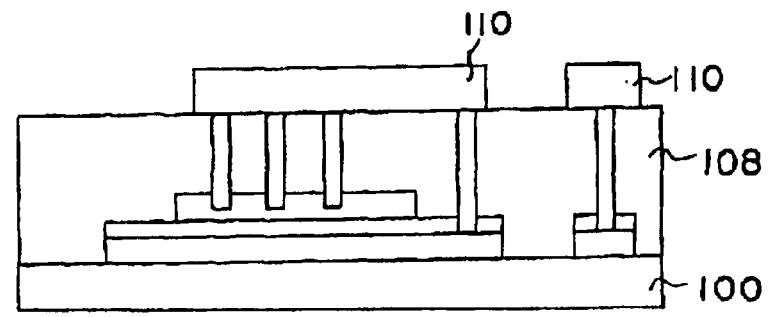

After the formation of the contact holes 109, a conductive metal (3M) is deposited on the interlayer film 108 and subjected to patterning to form conductive metals (3M) 110 as shown in FIG. 1(f), whereby a conductive layer is formed.

According to the semiconductor device manufacturing method of the present embodiment, since the upper electrode metal (CM) 103 and the lower electrode metal (2M) 101 are etched after the deposition of the upper electrode metal (CM) 103 on the insulating film 102, the insulating film 102 is covered with the upper electrode 104 upon etching of the metal (2M) and thereby not brought into direct contact with the resist, whereby deterioration in reliability of the insulating film can be prevented.

According to a method of manufacturing a semiconductor device of a second embodiment, an offset oxide film is formed over an upper electrode and an insulating film before the formation of a lower electrode of a capacitor in the conductive layer forming process step. The method of manufacturing the semiconductor device, according to the second embodiment will be described below using FIG. 2.

Figure 2A:
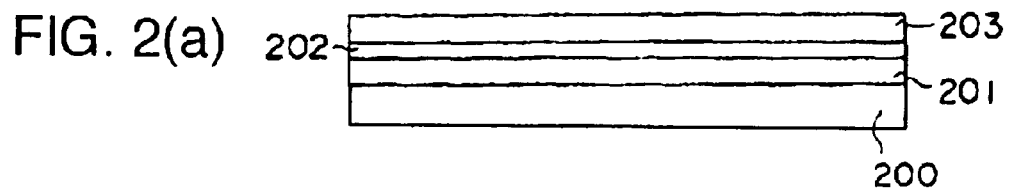
FIGS. 2(*a*) through 2(*g*) are respectively schematic cross-sectional views for describing process steps of a method of manufacturing a semiconductor device, according to a second embodiment.

In the present embodiment, a transistor (not shown) is firmed on a semiconductor substrate 200. Thereafter a capacitor lower electrode metal (2M) 201, an insulating film 202 such is an Si oxide film or the like, and a capacitor upper electrode metal (CM) 203 are deposited on the semiconductor substrate 200 in this order as shown in FIG. 2(a).

Figure 2B:
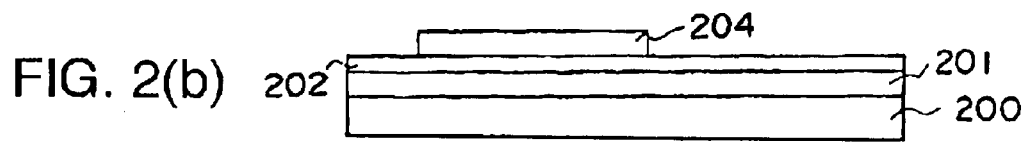

Next, the surface of the upper electrode metal (CM) 203 is coated with a resist, and an unnecessary area is removed from the metal (CM) 203 by etching and the metal (CM) 203 is patterned to form an upper electrode 204 on the insulating film 202 as shown in FIG. 2(b). Since, at this time, the insulating film 202 is interposed between the metal (CM) 203 and the metal (2M) 201 in a manner similar to the first embodiment, the resist is not directly applied onto its surface. Further, the resist placed over the upper electrode 204 and the insulating film 202 is removed by an organic release agent or the like after the etching.

Figure 2C:

After the formation of the upper electrode 204, an offset oxide film 205 is deposited over the surfaces of the upper electrode 204 and the insulating film 202 as shown in FIG. 2(c). An Si oxide film or the like can be used as the offset oxide film 205 in a manner similar to the insulating film 202. After the deposition of the offset oxide film 205, the metal (2M) 201 is etched to remove an unnecessary area and then patterned as shown in FIG. 2(d) to form a lower electrode 206.

When the resist that remains upon etching of the metal (2M) 201, is removed, the exposed surfaces of the upper electrode 204 and the insulating film 202 are covered with the offset oxide film 205 on the whole. It is therefore possible to prevent the organic release agent or the like from being infiltrated into upper electrode edge portions 207.

Figure 2D:
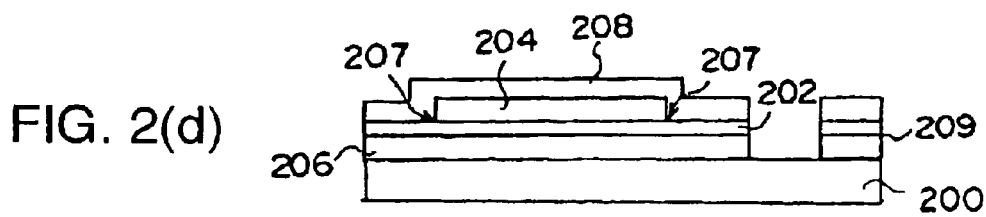

Thus, a capacitor 208 comprised of the upper electrode 204, the insulating film 202 and the lower electrode 206 is formed as shown in FIG. 2(d). In the present embodiment, the metal (2M) 201 is patterned to form the lower electrode 206 and form a conductive metal 209 comprised of the metal (2M) 201, the insulating film 202 and the offset oxide film 205.

Figure 2E:
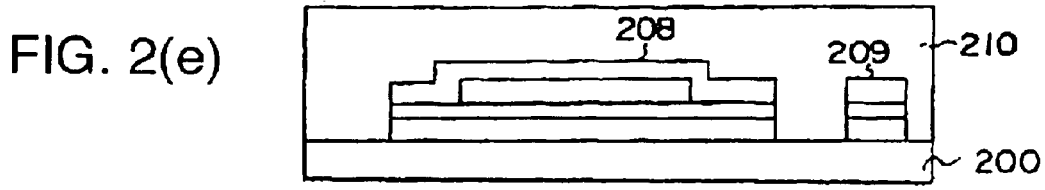

Thereafter, as shown in FIG. 2(e), an interlayer film 210 is deposited on the capacitor 208 and the conductive metal 209 by CVD using plasma. Further, the surface of the interlayer film 210 is planarized by CMP or the like. Since the insulating film 202 is covered with the offset oxide film 205 upon deposition of the interlayer film 210 by CVD using the plasma, damage produced due to the plasma can be reduced.

Figure 2F:
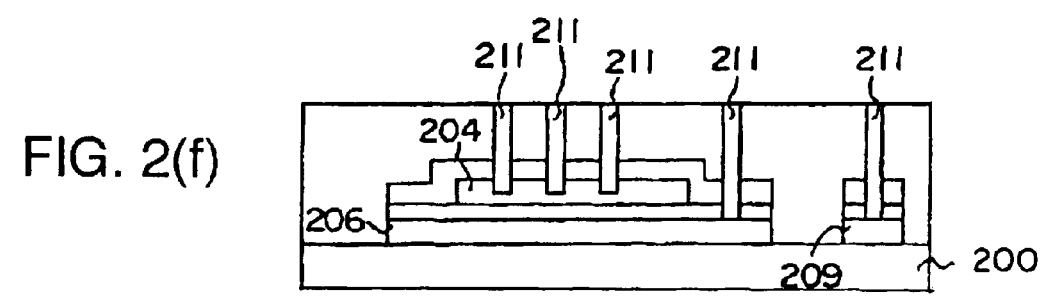
Figure 2G:
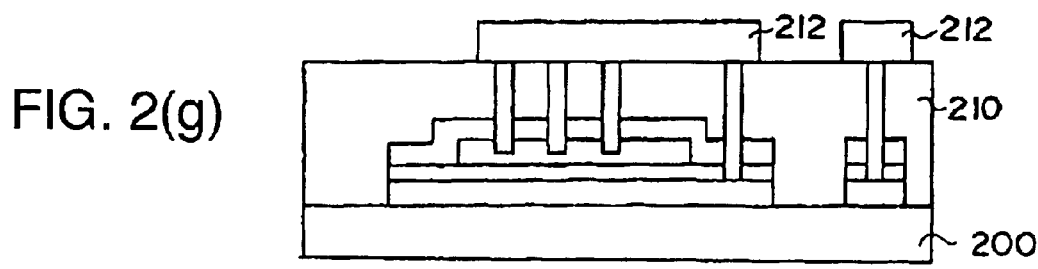

After the deposition of the interlayer film 210, contact holes 211 are formed on the upper electrode 204, the lower electrode 206 and the conductive metal 209 by block etching as shown in FIG. 2(f). Further, a conductive metal (3M) is deposited on the interlayer film 210 after the formation of the contact holes 211 and then patterned to form conductive metals (3M) 212 as shown in FIG. 2(g), whereby a conductive layer is formed.

According to the method of manufacturing the semiconductor device, according to the present embodiment, the offset oxide film is formed over the upper electrode and the insulating film before the formation of the lower electrode of the capacitor in the conductive layer forming process step. It is therefore possible to prevent the quality of the insulating film 202 near each upper electrode edge portion 207 from contacting the organic release agent or the like in addition to the prevention of a change in the film quality due to the direct contact of the resist to the insulating film 202 and to improve reliability of the insulating film 202. It is also possible to prevent deterioration of the insulating film 202 and a change in the quality thereof upon deposition of the interlayer film 210 by CVD and thereby improve reliability of the insulating film 202.

A method of manufacturing a semiconductor device of a third embodiment will be described using FIG. 3. Upon forming a conductive layer on a semiconductor substrate in a process similar to the second embodiment in the present embodiment, the insulating film and the offset film are formed of silicon oxide/nitride (SiON).

In the second embodiment, the whole surface of the insulating film 202 is covered with the offset oxide film 205 before the etching of the lower electrode metal (2M) 201. Therefore, the insulating film 202 near the upper electrode edge portions 207 is protected from infiltration of the organic release agent or the like upon etching of the metal (2M) 201.

Figure 3A:
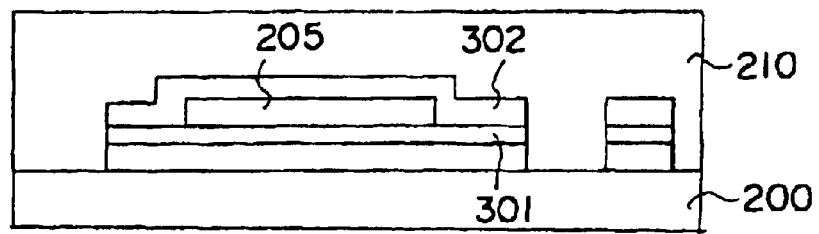
FIGS. 3(*a*) through 3(*c*) are respectively schematic cross-sectional views for describing process steps of a method of manufacturing a semiconductor device, according to a third embodiment.

Since an offset oxide film 302 formed of SiON is deposited on the surface of an insulating film 301 formed of SiON as shown in FIG. 3(a) in the present embodiment, it is capable of compensating for damage such as a reduction in the insulating film 301 which undergoes it upon forming the upper electrode 204.

Since the insulating film 301 and offset oxide film 302 both formed of SiON are low in etching rate as compared with the interlayer film 210, an etching-rate selection ratio between each of the insulating film 301 and offset oxide film 302 and the interlayer film 210 can be taken adequately.

Figure 3B:
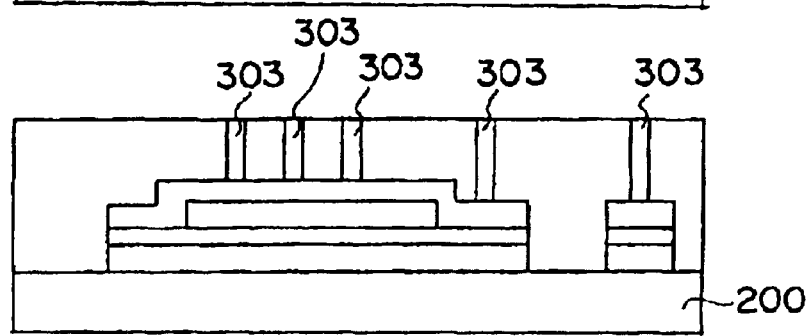
Figure 3C:
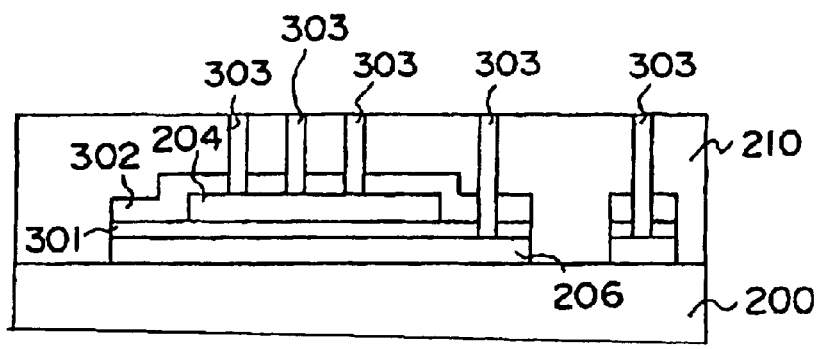

Therefore, even when the contact holes 303 are collectively formed by etching, etching first proceeds to an interface between the interlayer film 210 and the offset oxide film as shown in FIG. 3(b) regardless of the depth as viewed from the surface of the interlayer film 210. Thereafter, as shown in FIG. 3(c), etching proceeds in order of the offset oxide film 302 and the insulating film 301 to define the contact holes 303. However, since the depths from the interface between the offset oxide film 302 and the interlayer film 210 to the surfaces of the upper electrode 204 and the lower electrode 206 substantially remain unchanged so far, the upper electrode 204 is not excessively etched.

According to the semiconductor device manufacturing method showing the present embodiment, the formation of the insulating film and the offset oxide film by using SiON makes it possible to reduce deterioration or the like in the quality of the insulating film due to etching upon formation of the upper electrode in addition to advantageous effects obtained in the first and second embodiments and to provide a further improvement in the reliability of the insulating film. Since the etching-rate selection ration between the interlayer film and the offset oxide film can be taken adequately, it is possible to prevent the contact holes from being defined through the upper electrode.

Incidentally, in the present invention, the known ones can be suitably selected within the scope not impairing the effect of the present invention, as respective conditions for photolithography including the etching for forming the upper and lower electrodes of the capacitor, etc., conditions for respective members, etc.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device comprising:

providing a semiconductor substrate;

forming a first conductive layer on the substrate;

forming a first insulating layer on the first conductive layer;

forming a second conductive layer on the insulating layer;

selectively removing the second conductive layer to form an upper electrode;

selectively removing the first conductive layer to form a lower electrode and a conductive pattern after the formation of the upper electrode, the lower electrode having a top surface;

forming a second insulating layer on the upper and lower electrodes; and simultaneously forming a first contact hole and a second contact hole through the second insulating layer so that the first contact hole is slightly etched into the upper electrode and the second contact hole substantially exposes a region of the top surface of the lower electrode.

2. A method of manufacturing a semiconductor device according to claim 1, further comprising:

filling a conductive material into the first and second contact holes.

3. A method of manufacturing a semiconductor device according to claim 1, further comprising:

forming a third conductive layer on the second insulating layer and the conductive material in the contact holes.

4. A method of manufacturing a semiconductor device according to claim 1, wherein the second insulating layer is formed by plasma CVD.

5. A method of manufacturing a semiconductor device according to claim 1, wherein the first insulating layer is substantially removed with the first conductive layer simultaneously.

6. A method of manufacturing a c semiconductor device including a capacitor, comprising:

providing a semiconductor substrate;

forming a first conductive layer on the substrate;

forming a capacitor insulating layer on the first conductive layer;

forming a second conductive layer on the capacitor insulating layer;

selectively removing the second conductive layer to form an upper electrode;

forming an offset insulating layer on the upper electrode and the capacitor insulating layer;

selectively removing the first conductive layer to form a lower electrode and a conductive pattern after the formation of the upper electrode, the lower electrode and the conductive pattern each having a top surface;

forming an interlayer insulating layer on the upper and lower electrodes and the conductive pattern;

simultaneously forming a first contact hole, a second contact hole and a third contact hole through the interlayer insulating layer so that the first contact hole is slightly etched into the upper electrode and the second and third contact hole is substantially expose a region of the top surface of the lower electrode and a region of the top surface of the conductive pattern, respectively.

7. A method of manufacturing a semiconductor device according to claim 6, further comprising:

filling a conductive material into the first and second contact holes.

8. A method of manufacturing a semiconductor device according to claim 6, further comprising:

forming a third conductive layer on the interlayer insulating layer and the conductive material in the contact holes.

9. A method of manufacturing a semiconductor device according to claim 6, wherein the interlayer insulating layer is formed by plasma CVD.

10. A method of manufacturing a semiconductor device according to claim 6, wherein the offset insulating layer and the capacitor insulating layer are substantially removed with the first conductive layer simultaneously.

11. A method of manufacturing a semiconductor device according to claim 6, wherein the offset insulating layer is formed of an oxide.

12. A method of manufacturing a semiconductor device according to claim 6, wherein the offset insulating layer is formed of a silicon oxide/nitride.

13. A method of manufacturing a semiconductor device comprising:

providing a semiconductor substrate;

forming a first conductive layer on the substrate;

forming a first silicon oxide/nitride layer on the first conductive layer;

forming a second conductive layer on the first silicon oxide/nitride layer;

selectively removing the second conductive layer to form an upper electrode;

forming a second silicon oxide/nitride layer on the upper electrode and the first insulating layer;

selectively removing the first conductive layer to form a lower electrode and a conductive pattern after the formation of the upper electrode, the lower electrode and the conductive pattern each having a top surface;

forming an interlayer insulating layer on the upper and lower electrodes and the conductive pattern;

simultaneously forming a first contact hole, a second contact hole and a third contact hole through the interlayer insulating layer and the first and second silicon oxide/nitride layers so that the first contact hole is slightly etched into the upper electrode and the second and third contact holes substantially expose a region of the top surface of the lower electrode and a region of the top surface of the conductive pattern, respectively.

14. A method of manufacturing a semiconductor device according to claim 13, further comprising:

filling a conductive material into the first and second contact holes.

15. A method of manufacturing a semiconductor device according to claim 13, further comprising:

forming a third conductive layer on the interlayer insulating layer and the conductive material in the contact holes.

16. A method of manufacturing a semiconductor device according to claim 13, wherein the interlayer insulating layer is formed by plasma CVD.

17. A method of manufacturing a semiconductor device according to claim 13, wherein the first and second silicon oxide/nitride layers are substantially removed with the first conductive layer simultaneously.

18. A method of manufacturing a semiconductor device according to claim 1, wherein the lower electrode has a first width in a predetermined direction, the upper electrode has a second width in the predetermined direction, and the conductive pattern has a third width in the predetermined direction, the second width being smaller than the first width and the third width being smaller than the second width.

19. A method of manufacturing a semiconductor device according to claim 6, wherein the lower electrode has a first width in a predetermined direction, the upper electrode has a second width in the predetermined direction, and the conductive pattern has a third width in the predetermined direction, the second width being smaller than the first width and the third width being smaller than the second width.

20. A method of manufacturing a semiconductor device according to claim 13, wherein the lower electrode has a first width in a predetermined direction, the upper electrode has a second width in the predetermined direction, and the conductive pattern has a third width in the predetermined direction, the second width being smaller than the first width and the third width being smaller than the second width.

* * * * *